Nov. 16, 1965 R. J. REINTGEN ETAL 3,218,524
SEMICONDUCTOR DEVICES
Filed Oct. 12, 1961
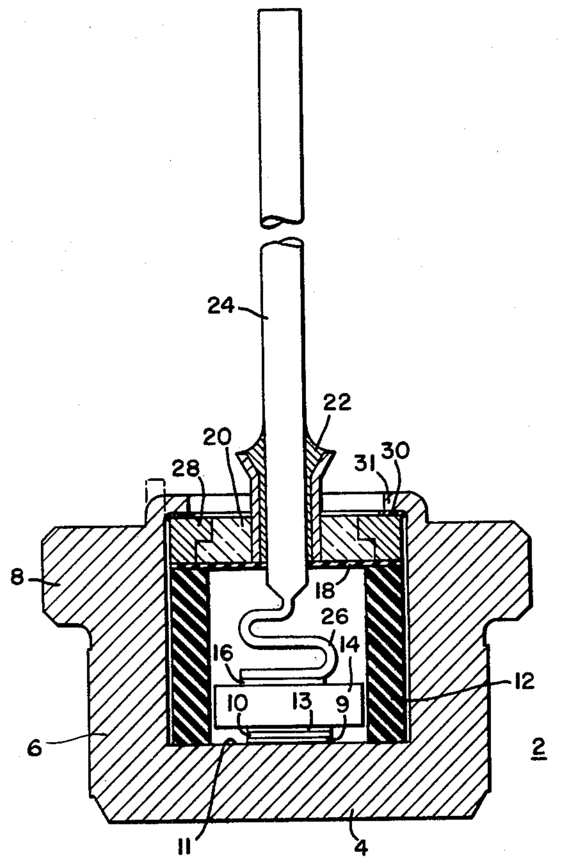
WITNESSES
John L. Heasley, Jr.
Raymond H. Majesko
INVENTORS
Robert J. Reintgen &
Frank V. Marcinko
BY
Frederick Shapoe
ATTORNEY United States Patent Office 3,218,524

Patented Nov. 16, 1965

3,218,524

SEMICONDUCTOR DEVICES

Robert J. Reintgen, Latrobe, and Frank V. Marcinko, Uniontown, Pa., assignors to Westinghouse Electric Corporation, East Pittsburgh, Pa., a corporation of Pennsylvania Filed Oct. 12, 1961, Ser. No. 144,687
3 Claims. (Cl. 317—234)

The present invention is concerned with improvements in or relating to semiconductor devices.

In known methods of fabricating semiconductor devices comprising a support member on which a semiconductor member is mounted, an electrically conductive lead or spring was joined, usually by soldering, to the semiconductor member in order to obtain electrical contact therewith. Many of these devices failed in operation because the solder layers between the electrical lead and the semiconductor member were not of uniform thickness and because the lead contact had not been made to all of the semiconductor member surface thus resulting in a reduction of the maximum electrical and thermal conductivity. Also, since solder is a poorer thermal conductor than copper, uneven solder layers cause thermal stresses resulting quite often in fracture of the semiconductor member. Furthermore, for the lower temperature applications the electrical leads were usually composed of copper which is relatively soft and as a result the leads were often bent slightly out of shape.

It has been found possible to produce improved semiconductor devices by the addition of a metallic disk of substantial size between the electrical lead and the semiconductor member, the disk being slightly larger in area than the semi-conductor member and thicker so that the mass is sufficient to cause the solder, between the disk and the semiconductor member, when molten, to flow and take the desired configuration. The utilization of such a metal conductor disk between the lead and the semiconductor member enables a uniform solder thickness to be maintained during fabrication and causes the even distribution of thermal, electrical and mechanical loads. The disk will also act as a heat sink for surge currents and will compensate for misaligned electrical leads because of its floating nature during the soldering operation.

The object of the present invention is to provide an improved semiconductor device by soldering a metal disk to the surface of a semiconductor element which element is mounted on a support, the metal disk enabling a more uniform distribution of electrical, mechanical and thermal loads.

A further object of the present invention is to provide a reliable, hermetically sealed semiconductor device comprising a support of a good thermally conductive metal mounting a semiconductor member from which support an upwardly extending cylindrical shell encompasses the member, the shell having an open end to which an insulating closure is joined thereby effecting a hermetic insulating seal, the closure having an electrical conductor passing therethrough which is soldered to a metallic disk joined to one surface of the semiconductor member.

Another object of the invention is to provide a semiconductor device comprising a good electrically and thermally conductive support member, the upper surface of the support member having an integral upwardly extending cylindrical shell, the inner surface of the shell being electrically insulated; a semiconductor member soldered to the upper surface of the support member within the cylindrical shell so that heat may be dissipated to the support member; a good thermally and electrically conductive metallic disk soldered to the upper surface of the semiconductor member; an insulating closure having an electrical conductor sealed therein and passing therethrough, the closure being joined to the open end of the cylindrical shell of the support member, the electrical conductor being electrically connected by a flexible connector to the metallic disk.

Other objects of the invention will in part, be obvious and will in part, appear hereinafter.

For a better understanding of the nature and objects of the invention reference should be had to the following detailed description and drawing, the single figure of which is an elevation view in cross section of the improved semiconductor device.

In accordance with the present invention and in attainment of the foregoing objects, there is provided a semiconductor device comprising (1) a good electrically and thermally conductive support member consisting of a metal selected from the group consisting of copper and copper-base alloys or silver and silver-base alloys or aluminum and aluminum-base alloys, and (2) a semiconductor member joined to the upper surface of the support member by means of a soft solder and a metallic disk serving as a counter electrode, having a larger diameter than the semi-conductor member is disposed coaxially on and soft soldered to the top surface of the semiconductor member. The metallic disk consists of a metal selected from the group consisting of copper and copper-base alloys or silver and silver-base alloys or aluminum and aluminum-base alloys. The metallic disk is positioned so as to distribute evenly with respect to the semiconductor member the thermal, electrical and mechanical loads and, further, to act as a heat sink to dissipate surge currents from the semiconductor member. One desired form of a mounting member comprising a sealing enclosure, adjacent the outer periphery of the support member there projects from the upper surface thereof an upwardly extending integral cylindrical shell having an open end and a peripheral flange at its upper extremity. An insulating closure, having an electrical conductor passing therethrough, is hermetically mounted and joined to the open end of the cylindrical shell of the support member. The inner circumference of the cylindrical shell is provided with an insulating means to prevent shorting between the metallic disk and the shell.

Referring to the figure of the drawing, there is shown a semiconductor device 2 comprising a support 4 and an integral upwardly extending open ended cylindrical shell 6 having a peripheral flange 8 at its upper end. A semiconductor member 10 is mounted on the upper surface 11 of the support 4, a soft solder layer 9 being located between the semiconductor member and the support. An insulating sleeve 12 is disposed within the cylindrical shell 6 and conforms closely to the inner circumference thereof, one end of the sleeve being situated on the upper surface 11 of support 4 and the other end being located a slight distance from the open end of the shell. Another soft solder layer 13 is applied to the upper surface of the semiconductor member 10 and a metallic disk 14 is disposed on solder layer 13. The metallic disk should be substantially larger than the member 10. Preferably, the ratio of diameters of the metallic disk to the semiconductor member is of the order of 2 to 1 and the ratio of the diameter of the disk to its thickness is about 3 to 1. The metallic disk 14 may comprise any good electrical and thermal conductor such as copper, copper-base alloys, silver, silver-base alloys, aluminum and aluminum-base alloys. Another soft solder layer 16 is applied to the upper surface of the metallic disk 14. The alloy solders may be initially applied as preforms and preferably all are of the same type and melting point, such as a lead-tin solder.

A relatively thin insulating washer 18 composed of a good electrical insulator such as mica, is disposed on the upper end of the insulating sleeve 12 within the cylindrical shell 6. On the upper surface of the washer 18 is mounted a preformed closure 20 having a metal tube 22 such as copper, passing therethrough, the tube 22 having a closely fitting soldered electrical conductor 24 passing therethrough. The electrical conductor 24 has a flattened S-curved segment 26 making contact to the upper surface of the metallic disk 14 at the lowermost flat portion of the curved segment. It should be understood that it is not necessary that the conductor 24 have a curved segment but such configuration is preferred since the stresses placed upon the metallic disk are more uniform. The electrical conductor 24 may be pretinned particularly at the lower surface of the curved segment 26 in lieu of employing a solder preform 16 between the curved segment and the metallic disk.

The closure 20 comprises an inverted L-shaped cross section metal ring 28 on its outer periphery to provide for joining the closure to the cylindrical shell. A ring shaped soft solder layer 30 is present between the metal ring member 28 and an upper lip 31 of the cylindrical shell 6. The lip is die formed over the metal ring to hold it in place.

In fabrication of the device 2, the die formed assembly with solder preforms is placed in a furnace containing an inert atmosphere and capable of maintaining a temperature of, for example, from 500° F. to 600° F., for a period of time whereby in a single heating cycle bonded solder joints are formed between the support member 4 and the semiconductor member 10 at the surface 11, the semiconductor member 10 and the metallic disk 14, the metallic disk 14 and the electrical conductor 24 at the lower end of the curved segment 26, the metallic ring 28 and the lip 31 of the shell 6 and between the conductor 24 and the tube 22 whereby a complete hermetic seal is effected.

Accordingly, it will be observed that in a single furnace operation a plurality of soldered joints are produced and an insulating glass closure is hermetically sealed to form a semiconductor device. While a semiconductor diode is shown, control devices such as transistors and other three terminal semiconductor devices may be similarly produced.

The device illustrated has been made and tested with excellent results. A high degree of reliability has been obtained. The device is especially useful as an automotive rectifier.

The following example is illustrative of the practice of this invention:

*Example 1*

A semiconductor device was assembled in accordance with the above procedure. The solders employed in bonding the semiconductor member to the support and the metallic disk, the metallic disk to the electrical conductor, the inverted L-cross section metallic ring to the lip of the cylindrical shell of the support and the electrical conductor to the metallic tube passing through the center of the closure was a 95% lead, 5% tin soft solder alloy with a melting point of about 590° F. The support member, cylindrical shell, metallic disk, electrical conductor, metallic tube and sealing lid were composed of copper. The ceramic sleeve was composed of a steatite and the semiconductor member was a wafer of silicon of a thickness of 5 mils and a diameter of 0.10 inch. The disk was of a diameter of 0.20 inch and 0.06 inch thick. The ratio of a diameter of disk to semiconductor member was 2:1 and the ratio of the diameter of the disk to its thickness was 3:1. The closure used to seal the open end of the shell was an aluminum silicate glass with a steel ring fused on its outer periphery. The assembly was placed in a furnace and heated to a temperature of about 600° F. in an inert atmosphere for a period of about twenty minutes. The device was then removed from the furnace, examined and tested. All of the joints formed were sound and continuous. Test results disclosed that the device was reliable and efficient and the silicon member appeared to be free of non-uniform stresses owing to the employment of the metallic disk between the silicon member and the electrical conductor.

A quantity of the diodes were made and tested and all were satisfactory. Similar devices made with an electrode of substantially the same diameter as the wafer were not uniform in their properties and a substantial proportion did not pass all required tests.

The invention may be applied to semiconductor wafers that are not circular, the counter electrode may be of circular or other shape, larger than the wafer, and centered substantially coaxially thereon.

Since certain changes in carrying out the above process and in the product embodying the invention may be made without departing from its scope, it is intended that the accompanying description and drawing be interpreted as illustrative and not limiting.

We claim as our invention:

1. A semiconductor device comprising an electrically and thermally conductive cylindrical shell having a support portion at the lower end thereof and a peripheral flange at the upper end thereof; a semiconductor member directly joined to the upper surface of the support portion within the cylindrical shell so that heat may be dissipated therefrom to the support; a good electrically and thermally conductive disk of an area larger than the semiconductor member joined to the upper surface of the semiconductor member to distribute evenly thereon thermal, electrical and mechanical loads and to act as a heat sink and to dissipate surge currents; an insulating sleeve disposed in the shell and conforming to the inner circumference thereof; an insulating closure having a metal ring joined to its outer periphery and having an electrical conductor sealed therein and passing therethrough hermetically joined to and closing the open end of the cylindrical shell and the electrical conductor being soldered to the electrically and thermally conductive disk.

2. A semiconductor device comprising a cylindrical shell having a support portion at the lower end thereof and a peripheral flange at the upper end thereof, the shell being composed of at least one material selected from the group consisting of copper, copper-base alloys, silver, silver-base alloys and aluminum and aluminum-base alloys; a semiconductor member joined directly to the upper surface of the support portion within the shell so that heat may be dissipated therefrom to the support; a metallic disk joined to the upper surface of the semiconductor member to distribute evenly thereon thermal, electrical and mechanical loads, to act as a heat sink and to dissipate surge currents, the disk of an area larger than the semiconductor member being composed of at least one material selected from the group consisting of copper, copper-base alloys, silver, silver-base alloys, aluminum and aluminum-base alloys, a ceramic insulating sleeve disposed in the shell and conforming to the inner circumference thereof; an insulating closure having a metal ring joined to its outer periphery and having an electrical conductor sealed therein and passing therethrough hermetically joined to and closing the open end of the cylindrical shell and the electrical conductor being soldered to the metallic disk.

3. An automotive rectifier comprising a cylindrical shell composed of copper, the shell having a support portion at the lower end thereof and a peripheral flange at the upper end thereof; a silicon semiconductor member joined to the upper surface of the support portion within the cylindrical shell so that heat may be dissipated therefrom to the support; a metallic disk of an area larger than the silicon member composed of copper joined to the upper surface of the silicon member to distribute evenly thereon thermal, electrical and mechanical loads, to act as a heat sink and to dissipate surge currents; a ceramic insulating sleeve consisting of a steatite disposed in the shell and conforming to the inner circumference thereof; an insulating closure having a metal ring joined to its outer periphery and having an electrical conductor sealed therein and passing therethrough hermetically joined to and closing the open end of the cylindrical shell and the electrical conductor being soldered to the copper disk.

References Cited by the Examiner

UNITED STATES PATENTS

| | | | |
|---|---|---|---|
| 2,780,759 | 2/1957 | Boyer et al. | 317—234 |
| 2,806,187 | 9/1957 | Boyer et al. | 317—234 |
| 2,960,639 | 11/1960 | Tipple | 317—234 |
| 3,030,558 | 4/1962 | Berg et al. | 317—234 |
| 3,047,780 | 7/1962 | Metz | 317—234 |
| 3,059,157 | 10/1962 | English et al. | 317—234 |

FOREIGN PATENTS

| | | |
|---|---|---|
| 1,233,357 | 5/1960 | France. |
| 849,972 | 9/1960 | Great Britain. |
| 875,823 | 8/1961 | Great Britain. |

DAVID J. GALVIN, *Primary Examiner.*

JAMES D. KALLAM, *Examiner.*